United States Patent [19]

Berkenblit et al.

[11] 3,964,942

[45] June 22, 1976

[54] CHEMICAL POLISHING OF SINGLE CRYSTAL DIELECTRICS

[75] Inventors: Melvin Berkenblit; Arnold Reisman, both of Yorktown Heights, N.Y.

[73] Assignee: International Business Machines Corporation, Armonk, N.Y.

[22] Filed: Oct. 16, 1970

[21] Appl. No.: 81,610

[52] U.S. Cl. .................................. 156/2; 156/20; 252/79.2; 357/4; 357/60
[51] Int. Cl.² ........................................ C23G 1/36
[58] Field of Search ........................... 156/2, 17, 20; 252/79.2; 357/4, 60

[56] References Cited
UNITED STATES PATENTS

| | | | |
|---|---|---|---|
| 1,482,793 | 2/1924 | Hartman ............................. | 156/2 |
| 2,967,136 | 1/1961 | Cybriwsky et al. ................ | 204/140.5 |
| 3,042,566 | 7/1962 | Hardy ................................. | 156/2 |
| 3,106,499 | 10/1963 | Kendall ............................. | 204/140.5 |

OTHER PUBLICATIONS

Scheuplein et al. Surface Structure of Corundum, Jour. Amer. Ceramic Soc., pp. 458–472, Sept., 1960. (vol. 43).

*Primary Examiner*—Marion E. McCamish
*Assistant Examiner*—R. J. Roche
*Attorney, Agent, or Firm*—Thomas J. Kilgannon, Jr.

[57] ABSTRACT

A polishing method for single crystal dielectrics such as sapphire and magnesium spinel is disclosed. A single crystal wafer of sapphire or magnesium spinel is immersed in a mixture of sulphuric and phosphoric acid in a range of mixtures of 9 parts sulphuric acid to 1 part phosphoric acid to 1 part sulphuric acid to 9 parts phosphoric acid by volume while the mixture is held at a temperature in the range of 200°–325°C. The rate of polishing as well as the quality of polishing of the wafers of sapphire or magnesium spinel is orientation sensitive and polishing is achieved for magnesium spinel having the orientations (100) and (110). Polishing is achieved for sapphire having the orientations (0001), (11$\bar{2}$3), (1$\bar{1}$00), (11$\bar{2}$4), (11$\bar{2}$0) and (01$\bar{1}$2). A wafer to be polished is suspended in the heated solution and may be rotated slowly. Nonpreferential material removal rates of fractions of a micron per minute are obtained. Crystals of both sapphire and spinel having the above-mentioned orientations may be polished in a preferred temperature range of 250°–300°C. The preferred polishing mixture for sapphire is 1 part sulphuric acid to 1 part phosphoric acid by volume at a temperature of 285°C. For magnesium spinel, the preferred mixture is 3 parts sulphuric acid to 1 part phosphoric acid at a temperature of 250°C. The polishing technique of the present invention provides planar, polished surfaces which are free of insoluble residues on the polished surface.

8 Claims, No Drawings

CHEMICAL POLISHING OF SINGLE CRYSTAL DIELECTRICS

BACKGROUND OF THE INVENTION

1. Field of the Invention

This invention relates generally to methods for the nonselective etching or polishing of single crystal dielectric materials as opposed to milling or preferential etching. More specifically, it relates to a method for nonselectively etching or polishing single crystals of sapphire ($\alpha$-$Al_2O_3$) and magnesium spinel ($MgO \cdot Al_2O_3$) by immersing wafers of such materials in mixtures of sulphuric and phosphoric acid at relatively low temperatures to obtain acceptable polishing rates.

2. Description of the Prior Art

In the manufacture of semiconductor devices where epitaxial depositions of semiconductor material are utilized to form a substrate on which active devices are formed, great care is taken to provide a surface which is free from pitting, growths and other spurious formations and to provide a surface which is smooth, shiny and absolutely planar. Where the surface upon which epitaxial deposition is to be carried out is a semiconductor, chemical and electrochemical polishing techniques have been developed by the prior art which provide substrate surfaces of the desired characteristics and quality. More recently, however, the semiconductor art has sought to replace the semiconductor substrate with dielectric materials such as sapphire to achieve electrical isolation of active devices which are ultimately formed in a deposited epitaxial semiconductor layer. One material which is undergoing wide experimentation for such purpose is sapphire. Silicon, for example, has been epitaxially deposited on the surface of wafers of single crystal sapphire.

Up until the present, the surfaces achieved by known polishing techniques have been only marginally satisfactory. Further, chemical polishing techniques have been erratic and difficult to reproduce and control. Further still, the semiconductor art has advanced to the point where devices of extremely small size have been fabricated and where devices of even smaller size are being contemplated. The dimensions of the contemplated devices are roughly equivalent to the departure from planarity of portions of the surface of sapphire wafers polished by known techniques. The quality of the subsequently deposited epitaxial layer in which devices are to be formed is extremely sensitive to the surface condition of the substrate. Under such circumstances, using conventional masking, photolithographic and etching techniques, the desired dimensional resolution cannot be obtained and the quality of deposited layers is questionable. One way to obtain the desired dimensional resolution would be to enhance the smoothness and planarity of the substrate upon which epitaxial deposition is to be carried out. Mechanical polishing techniques while providing satisfactory surfaces from the point of view of planarity and surface appearance, provide wafers which have massive mechanical damage to the crystal surface to the point where it is substantially amorphous in nature. Such surfaces are also unsuitable for subsequent expitaxial deposition. Prior chemical polishing art techniques such as heating a sapphire wafer in a reducing atmosphere of hydrogen do not produce the desired surface quality. Immersing a sapphire wafer in pure phosphoric acid at temperatures of 400°C and higher produces unpredictable, insoluble residues and pitting on the surface of a single crystal sapphire wafer. Continued heating of the acid causes polymerization of the acid producing an almost insoluble coating on the surface in addition to other residues. synthetic alumina has been treated with fused anhydrous sodium tetraborate to obtain smooth surfaces at temperatures of 750°–800°C. This technique has not been found to be satisfactory for producing surfaces suitable for semiconductor epitaxy.

Another known technique which was found to be unsatisfactory was the vapor phase etching of sapphire by inorganic fluorides at elevated temperature.

Mixtures of sulphuric acid and phosphoric acid have been shown in issued patents to accomplish the chemical milling of cermets and ceramics such as alumina which is aluminum oxide. One such patent is U.S. Pat. No. 3,042,566 entitled "Chemical Milling", in the name of J. A. Hardy and assigned to the Boeing Airplane Company. The patent makes a point of indicating that it deals with the chemical milling of alumina as opposed to the chemical polishing of alumina. The prior art techniques mentioned hereinabove all dealt with the chemical polishing of a form of aluminum oxide including single crystal sapphire. The patent just referred to operates in a temperature range of 288° to 399°C and utilizes mixtures of sulphuric acid and phosphoric acid to accomplish the chemical milling of alumina. The chemical milling technique is utilized to reduce the weight of certain members of an airplane and no mention is made anywhere in the patent to indicate that single crystal materials were even contemplated. Further, the patent indicates that the minimum temperature must be approximately 600°F (315°C) in order to realize a milling rate of any value. Thus, chemical milling in the patent only occurs at temperatures of 315°C and above whereas in the present disclosure, as will be seen hereinafter, polishing at substantial removal rates take place at 325°C and below for both single crystal sapphire and magnesium spinel. To further indicate the inapplicability of the above-mentioned patent as pertinent prior art, no mention is made in the patent concerning the effect of orientation on surface quality. This is to be expected since the patent is not dealing with single crystal materials. Since the process of the patent is a rather gross process concerned with weight reduction rather than in improving the surface of a wafer on a microscopic level, it is not surprising that a distinction between chemical milling and polishing was made and that the ability to polish using sulphuric and phosphoric mixtures was not even mentioned in the patent.

U.S. Pat. No. 2,650,156 in the name of E. Shelton-Jones and assigned to Aluminum Company of America suggests the use of a mixture of 1 part phosphoric acid to 2 parts sulphuric acid by volume heated to 125°C for the brightening of aluminum. This patent does not deal with single crystal materials and, further, the brightening action is carried out at a temperature which is far too low for the polishing of single crystal materials.

Thus, while the prior art suggests the use of various mixtures of sulphuric and phosphoric acids for the chemical milling or brightening of aluminum oxide at various temperatures, none of the known prior art teaches the polishing of single crystal sapphire or magnesium spinel in the temperature range taught by the present invention. The surface quality required for epitaxial deposition cannot be provided by any of the known techniques. Also, the known prior art does not teach the specific temperature ranges required or the specific orientations of the crystalline structures upon which polishing can be achieved.

SUMMARY OF THE INVENTION

The method of the present invention, in its broadest aspect, comprises the step of immersing a single crystal of sapphire or magnesium spinel in a mixture of sulphuric acid and phosphoric acid in a range of mixtures of 9 parts sulphuric acid to 1 part phosphoric acid to 1 part sulphuric acid to 9 parts phosphoric acid by volume while the mixture is being held at a temperature in the range of 200°–325°C. The magnesium spinel single crystal has one of the orientations (100) or (110). The sapphire single crystal has one of the orientations (0001), (11$\bar{2}$3), (1$\bar{1}$00), (11$\bar{2}$4), (11$\bar{2}$0) and (01$\bar{1}$2). While immersed, the wafer to be polished may be rotated slowly.

In accordance with more particular aspects of the invention, both the single crystal sapphire and magnesium spinel substrates are polished in a preferred temperature range of 250°–300°C.

Still more specifically, sapphire substrates having the above-mentioned orientations are preferably polished at a temperature of 285°C in a mixture of 1 part sulphuric acid to 1 part phosphoric acid by volume. For magnesium spinel, substrates having the orientations mentioned above are preferably polished at a temperature of 250°C in a mixture of 3 parts sulphuric acid to 1 part phosphoric acid.

It is therefore, an object of this invention to provide a method for chemically polishing single crystals of dielectric materials such as the sapphire and magnesium spinel.

Another object is to provide substrates of sapphire and magnesium spinel which are damage free, planar and suitable for the epitaxial deposition of semiconductor materials on a surface thereof.

Still another object is to provide a method for polishing single crystal materials such as sapphire and magnesium spinel at adequate etch rates and at temperatures below 400°C.

Another object is to provide a method for polishing sapphire and magnesium spinel which produces surfaces which are free of pits and insoluble residues on the polished surface.

The foregoing and other objects, features and advantages of the invention will be apparent from the following more particular description of a preferred embodiment of the invention.

DESCRIPTION OF THE PREFERRED EMBODIMENT

Before addressing the preferred method of the present invention, the distinction between selective and nonselective etching should be understood to point up the differences between polishing and etching. The term selective etching is another way of defining what is usually meant by the term etching. When a material is selectively etched, it means that the etchant preferentially attacks certain portions of the surface of a substrate in accordance with certain conditions which may vary from place to place on the surface of the substrate. Thus, selective etching will attack a portion having one orientation more than another; it will attack a portion having a slightly different composition, or, it will preferentially remove material in cracks and fissures and the like. The result of the interaction between a selective etch and a substance is that certain or selected regions are preferentially eroded and a clean, eroded, pitted surface is the best that can be expected using such etchants. In fact, such etching actions are the basis for delineating microscopic defects in single crystal materials and represent the normal etching behavior of most solvents.

In nonselective etching or polishing, the etchant uniformly attacks a surface regardless of its orientation, local variations in composition, or prior surface condition such that all materials are nonselectively or nonpreferentially removed. Under such circumstances, pitting and the formation of craters and other spurious surface conditions are eliminated and a smooth substantially planar surface is provided. Such behavior is unpredictable and relatively rare.

In the present application, polishing or nonselective etching is being carried out. For purposes of the present invention, selective etching or chemical milling or other phenomenon which would produce pitted and cratered surfaces or surfaces having microscopic or macroscopic residues remaining on them are specifically avoided.

In carrying out the polishing procedure of the present invention, the desired sulphuric-phosphoric acid mixture is placed in a platinum crucible and heated to the desired temperature. Any material which is not attacked by the acid mixture may be utilized for the crucible. To carry out the polishing, a wafer of sapphire or magnesium spinel suspended in a platinum wire basket is immersed in the mixture for a time sufficient to achieve polishing. The wafer being polished may be rotated by conventional means at a slow rate to aid in the removal of polishing products from the surface of the wafer.

In determining whether or not polishing of sapphire and magnesium spinel is achieved by the sulphuric-phosphoric acid mixtures to be defined hereinbelow, the appearance of both of these materials after immersion in pure sulphuric and pure phosphoric acid was utilized as a criterion. Wafers of highly mechanically polished sapphire ($\alpha$-$Al_2O_3$) and magnesium spinel ($MgO.Al_2O_3$) which are available from commercial sources (sapphire wafers are available from Insaco, Quakertown, Penna., and magnesium spinel wafers are available from Union Carbide, San Diego, Calif.) are acted upon by both pure phosphoric acid and by pure sulphuric acid over a range of temperatures of 200°–325°C. The action of the pure acids on the wafers, however, falls more into the category of selective etching rather than nonselective etching or polishing. The latter result is, of course, the sought for action of an etchant on sapphire and magnesium spinel. Where pure sulphuric acid is utilized, some material removal takes place at first but then, a white insoluble residue forms on the surface of both spinel and sapphire wafers to the point where further attack by the acid is impossible. Where pure phosphoric acid is utilized, pitting occurs for all temperatures from 200°C and up. Further, unpredictably insoluble residues deposit upon the surface. Using pure phosphoric acid, the quality of the surfaces produced is such that further application in epitaxial processes is useless. Also, in the pure state, phosphoric acid loses water at higher temperatures, and a polymerization-like action takes place in the acid. As water is lost, the solubility of the etch products decreases and an insoluble residue is ultimately formed on the surface of the wafers which requires additional handling. By forming mixtures of phosphoric and sulphuric acids, nonselective etching can be achieved and the appearance of insoluble residues is eliminated.

Using a wafer of sapphire which has been immersed in pure phosphoric acid as a criterion for surface condition quality, the addition of small amounts of sulphuric acid immediately provides an improvement in surface appearance and eliminates the formation of insoluble residues. A mixture which contains 9 parts of phosphoric acid to 1 part sulphuric acid by volume, for example, provides greatly improved surface quality relative to that provided by pure phosphoric acid for both sapphire and spinel at reasonable material removal rates. Reasonable material removal rates are on the order of fractions of a micron per minute. In like manner, a mixture of 9 parts sulphuric acid to 1 part phosphoric acid provides improved surface quality at reasonable material removal rates. Both of the mixtures mentioned polish both sapphire and magnesium spinel over a temperature range of 200°–325°C. Using the above-described mixtures, the highest quality surfaces are not achieved, but the quality of the surfaces obtained is so markedly improved over that obtained using pure acids that, for purposes of the present invention, polishing can be said to have taken place.

The mixtures just mentioned represent the extremities of a range of mixtures over which polishing can be achieved for both sapphire and magnesium spinel. As will be shown in more detail in what follows, better surfaces are obtained in preferred ranges of mixtures for both sapphire and magnesium spinel over the temperature range of 250°–300°C, and the best surfaces are obtained by a preferred mixture for each material at preferred temperatures.

For both sapphire and spinel, mixtures of 3 parts sulphuric acid to 1 part phosphoric acid to 1 part sulphuric acid to 3 parts phosphoric acid by volume is a preferred mixture range. Mixtures in the preferred range provide high quality surfaces at reasonable material removal rates over the temperature range of 250°–300°C. When mixtures containing greater amounts of sulphuric acid than 3 parts sulphuric acid to 1 part phosphoric acid were utilized, rill-like formations were observed on the surface of sapphire wafers. These rills did not occur consistently in all samples and may result from the presence of massive damage during the initial preparation of the wafer. It is believed that very careful handling in the initial preparation of the wafers will eliminate such rills. The rill-like formations did not appear in any of the spinel samples and excellent surface quality was achieved over the preferred mixture and temperature range.

The best overall surface quality for sapphire can be achieved using a 1 part sulphuric acid to 1 part phosphoric acid by volume mixture at a temperature of 285°C. For magnesium spinel, the preferred mixture of 3 parts sulphuric acid to 1 part phosphoric acid by volume at a temperature of 250°C provides the best surface quality. These preferred polishing mixtures and temperatures not only provide the best material removal rates, but also, the resulting surfaces are smooth and planar and exhibit no deleterious characteristics whatsoever.

As indicated hereinabove, not all orientations of sapphire and spinel can be polished in the mixture ranges discussed. Thus, magnesium spinel having orientations of (100) and (110) can be polished over the entire mixture and temperature range and wafers exhibiting improved surface qualities are provided. Wafers of magnesium spinel having a (111) orientation, however, could not be polished using any mixture combination and only wafers having extremely poor surface quality are obtained, i.e., preferential etching rather than polishing occurred. With respect to sapphire, the orientations (0001) and (11$\bar{2}$3) provide a suitable surface and are excellent from the point of view of removal rate in that high removal rates are achieved. Sapphire single crystals having the orientations (1$\bar{1}$00), (11$\bar{2}$4), (11$\bar{2}$0) and (01$\bar{1}$2) are also excellent in terms of the surface quality achieved, but are somewhat slower from the point of view of removal rate. Sapphire having an orientation of (1$\bar{1}$02) provided poor surfaces when polishing was attempted. From this, it may be appreciated that not all orientations are susceptible to polishing using the mixtures described hereinabove and that there is no way of predicting that a mixture which polishes for one orientation will polish another orientation. From the data obtained thus far, it appears that if one mixture polishes a given orientation, all mixtures in the range will polish over the whole temperature range; the only variable being the removal rate.

The following table shows the variation in removal rate for a sapphire wafer over a mixture range of 9 parts $H_2SO_4$ to 1 part $H_3PO_4$ to 1 part $H_2SO_4$ to 9 parts $H_3PO_4$ by volume at a temperature of 285°C.

| MIXTURE (By Volume) | REMOVAL RATE $\mu$m/min | SURFACE QUALITY |
|---|---|---|
| 9 parts $H_2SO_4$ to 1 part $H_3PO_4$ | .18 | Good |
| 3 parts $H_2SO_4$ to 1 part $H_3PO_4$ | .185 | Better |
| 1 part $H_2SO_4$ to 1 part $H_3PO_4$ | .15 | Best |
| 1 part $H_2SO_4$ to 3 parts $H_3PO_4$ | .13 | Better |
| 1 part $H_2SO_4$ to 9 parts $H_3PO_4$ | .10 | Good |

The following table shows the variation in removal rate for a magnesium spinel wafer over a mixture range of 9 parts $H_2SO_4$ to 1 part $H_3PO_4$ to 1 part $H_2SO_4$ to 9 parts $H_3PO_4$ by volume at a temperature of 250°C.

| MIXTURE (By Volume) | REMOVAL RATE $\mu$m/min | SURFACE QUALITY |
|---|---|---|
| 9 parts $H_2SO_4$ to 1 part $H_3PO_4$ | .105 | Good |
| 3 parts $H_2SO_4$ to 1 part $H_3PO_4$ | .11 | Best |
| 1 part $H_2SO_4$ to 3 parts $H_3PO_4$ | .125 | Better |
| 1 part $H_2SO_4$ to 9 parts $H_3PO_4$ | .125 | Good |

The sulphuric acid utilized in the practice of the present invention is concentrated sulphuric acid which is a concentrated aqueous solution containing 95–98 weight percent $H_2SO_4$. The phosphoric acid utilized is concentrated phosphoric acid which is concentrated aqueous solution containing 85 weight percent $H_3PO_4$.

The orientations indicated hereinabove are will known to those skilled in the art of crystallography. The nomenclature utilized [(111), (1$\bar{1}$00)]describes the sets of planes within a crystal lattice which can form crystal faces and these are characterized as Miller Indices. For a more detailed explanation of Miller Indices, Van Nostrand's Scientific Encyclopedia, Third Edition, may be consulted under Crystallography on page 456. The subject is also discussed in still more detail in the "Textbook of Physical Chemistry" by S. Glasstone, Second Edition, p. 340–346. D. Van Nostrand Company, Inc.

While the invention has been particularly described with reference to preferred method steps, it will be understood by those skilled in the art that various changes in details may be made therein without departing from the spirit and scope of the invention.

What is claimed is:

1. A method for polishing single crystals of sapphire and magnesium spinel comprising the steps of:

immersing a single crystal substrate selected from the group consisting of sapphire and magnesium spinel in a mixture of sulphuric acid and phosphoric acid in a range of mixtures of 9 parts sulphuric acid to 1 part phosphoric acid to 1 part sulphuric acid to 9 parts phosphoric acid by volume said mixture being held at a temperature in the range of 200°–325°C, said magnesium spinel single crystal having one of the orientations (100) and (110) and said sapphire single crystal having one of the orientations $(0001)$, $(11\bar{2}3)$, $(1\bar{1}00)$, $(11\bar{2}4)$, $(11\bar{2}0)$ and $(01\bar{1}2)$ for a time sufficient to achieve polishing of said substrate.

2. A method for polishing single crystals of sapphire comprising the step of:

immersing a single crystal substrate of sapphire in a mixture of sulphuric acid and phosphoric acid in a range of mixtures of 9 parts sulphuric acid to 1 part phosphoric acid to 1 part sulphuric acid to 9 parts phosphoric acid by volume said mixture being held at a temperature in the range of 200°–325°C, said sapphire single crystal having one of the orientations $(0001)$, $(11\bar{2}3)$, $(1\bar{1}00)$, $(11\bar{2}4)$, $(11\bar{2}0)$ and $(01\bar{1}2)$ for a time sufficient to achieve polishing.

3. A method for polishing single crystals of magnesium spinel comprising the step of:

immersing a single crystal substrate of magnesium spinel in a mixture of sulphuric acid and phosphoric acid in a range of mixtures of 9 parts sulphuric acid to 1 part phosphoric acid to 1 part sulphuric acid to 9 parts phosphoric acid by volume said mixture being held at a temperature in the range of 200°–325°C, said magnesium spinel single crystal having one of the orientations (100) and (110) for a time sufficient to achieve polishing.

4. A method according to claim 1 further including the step of rotating said substrate slowly to remove polishing products from the surface.

5. A method according to claim 2 wherein said mixture range is preferably 3 parts sulphuric acid to 1 part phosphoric acid to 1 part sulphuric acid to 3 parts phosphoric acid by volume and said temperature range is preferably 250° to 300°C.

6. A method according to claim 2 wherein said mixture is preferably 1 part sulphuric acid to 1 part phosphoric acid by volume and said temperature is preferably 285°C.

7. A method according to claim 3 wherein said mixture range is preferably 3 parts sulphuric acid to 1 part phosphoric acid to 1 part sulphuric acid to 3 parts phosphoric acid by volume and said temperature range is preferably 250° to 300°C.

8. A method according to claim 3 wherein said mixture is preferably 3 parts sulphuric acid to 1 part phosphoric acid by volume and said temperature is preferably 250°C.

* * * * *